US006462619B1

(12) United States Patent
Ivanov et al.

(10) Patent No.: US 6,462,619 B1
(45) Date of Patent: Oct. 8, 2002

(54) INPUT STAG OF AN OPERATIONAL AMPLIFIER

(75) Inventors: Vadim V. Ivanov; Shilong Zhang, both of Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/756,259

(22) Filed: Jan. 8, 2001

(51) Int. Cl.[7] .................................................. H03F 3/45
(52) U.S. Cl. ...................................... 330/253; 330/257
(58) Field of Search ................................ 330/253, 257, 330/258, 261

(56) References Cited

U.S. PATENT DOCUMENTS

| | | | |
|---|---|---|---|
| 4,555,673 A | 11/1985 | Huijsing et al. | 330/258 |
| 5,500,624 A | 3/1996 | Anderson | 330/253 |
| 5,550,510 A | 8/1996 | Nararaj | 330/253 |
| 5,714,906 A | * 2/1998 | Motamed et al. | 330/253 |
| 5,734,297 A | 3/1998 | Huijsing et al. | 330/253 |
| 5,745,007 A | 4/1998 | Redman-White | 330/253 |
| 6,124,760 A | * 9/2000 | Hong | 330/253 |
| 6,194,962 B1 | * 2/2001 | Chen | 330/253 |

OTHER PUBLICATIONS

Ron Hogervost, John P. Terro, Ruud G. H. Eschauzier, and Johan H. Huijsing; A Compact Power–Efficient 3 V CMOS Rail–To–Rail Input/Output Operational Amplifier For VLSI Cell Libraries; Dec. 1994; IEEE Journal of Solid–State Circuits. vol 29, No. 12, pp. 1505–1512.

Dennis M. Monticelli; A Quad CMOS Single–Supple OP Amp With Rail–To–Rail Output Swing; Dec. 1986; IEEE Journal of Solid–State Circuit vol. SC–21, No. 6, pp. 1026–1034.

Johan H. Huijsing, Low–Power Low Voltage VLSI Operational Amplifier Cells, IEEE Transactions on Circuits and Systems,vol. 42, No.11 Nov. 1995, pp. 841–52.

Sander L. J. Gierkink et al., Design Aspects of a Rail–to–Rail CMOS Op–Amp, 1997, pp. 23–28.

Ron Hogervost, John P. Terro, Ruud G. H. Eschauzier, and Johan H. Huijsing; A Compact Power–Efficient 3 V CMOS Rail–To–Rail Input/Output Operational Amplifier For VLSI Cell Libraries; Dec. 1994; IEEE Journal of Solid–State Circuits. vol 29, No. 12, pp. 1505–1512.

Dennis M. Monticelli; A Quad CMOS Single–Supple OP Amp With Rail–To–Rail Output Swing; Dec. 1986; IEEE Journal of Solid–State Circuit vol. SC–21, No. 6, pp. 1026–1034.

* cited by examiner

Primary Examiner—Benny Lee
Assistant Examiner—Khanh Van Nguyen
(74) Attorney, Agent, or Firm—Snell & Wilmer L.L.P.

(57) ABSTRACT

An input to a rail-to-rail, FET, operational amplifier having a transconductance that is constant throughout the operating range of the operational amplifier is presented. The input of an operational amplifier typically includes an input stage, a current source and a current transfer circuit, wherein the input stage comprises both N-type transistors and P-type transistors. The present application discloses the use of a duplicate of those elements: a proportional input stage, a proportional current source, and a proportional current transfer circuit, which together are used to emulate the operation of the input stage. By monitoring these proportional duplicates, one can determine when both input pairs are operating. When both input pairs are operating, a minimum selector circuit interfaces with the current transfer circuit to reduce the current supplying one of the input pair transistors, thus reducing the overall transconductance of the circuit.

24 Claims, 9 Drawing Sheets

INPUT STAG OF AN OPERATIONAL AMPLIFIER

BACKGROUND OF THE INVENTION

1. Technical Field

The present invention relates to operational amplifiers ("op-amps") and more particularly to a rail-to-rail input stage of a CMOS op-amp having a constant transconductance which is independent of the common-mode input voltage.

2. Background Information

An exemplary two-stage op-amp configuration 10 is illustrated in FIG. 1. Op-amp 10 contains amplifier stage 100 and amplifier stage 102. Amplifier stage 100 comprises a transconductance amplifier with a differential input stage, i.e., there are two input terminals in amplifier stage 100: negative input 106 and positive input 108. Amplifier stage 100 is configured to provide an output current to amplifier stage 102 that is proportional to the difference in voltage between input 106 and 108.

Amplifier stage 102 comprises a high-gain amplifier. A capacitor 104 is connected in a feedback loop between an output 110 of amplifier stage 102 and an input 112 of amplifier stage 102. Capacitor 104 is present to ensure that the op-amp is stable when the op-amp is operated in a feedback configuration. For an amplifier stage 102 with a sufficiently large gain, the total gain of amplifier stage 100 and amplifier stage 102 is $G_m/sC$, where $G_m$ is the transconductance of amplifier stage 100 and C is the capacitance of capacitor 104. Thus, the op-amp has the frequency response of a low-pass amplifier, as illustrated in FIG. 2. The gain versus frequency curve 200 shows that the gain is reasonably stable at low frequencies, but is continually reduced at higher frequencies. Corner frequency 210 is approximately the frequency at which the gain starts decreasing.

For operation, amplifiers require a power source. This power source is typically in the form of a supply voltage. While supply voltages in the range of 5 to 10 volts were largely used in the past, supply voltages have more recently decreased to below 3 volts, with supply voltages below 1 volt being introduced. At these low voltages, it is commonly desired for an op-amp to operate at input voltages close to that of the power supply to facilitate a larger range of operation. This operational characteristic is termed "rail-to-rail" operation.

An op-amp circuit using only P-type transistors can only operate within a voltage range from the negative supply rail to the positive supply rail minus the gate-source voltage, $V_{GS}$, and the saturation voltage, $V_{dsat}$, of a tail current source. Analogously, an op-amp circuit using only N-type transistors can operate only from the positive supply rail down to $V_{GS}$ and $V_{dsat}$ above the negative rail voltage. Accordingly, in order to achieve rail-to-rail operation, a circuit must use both P-type transistors and N-type transistors.

One circuit that illustrates a CMOS differential input stage of a rail-to-rail op-amp is shown in FIG. 3. The input stage comprises two pairs of input transistors driven in parallel: P-type transistors 300 and 302; and N-type transistors 304 and 306. A current source 308 supplies the current for P-type transistors 300 and 302 while a current source 310 supplies the current for N-type transistors 304 and 306. A negative terminal 320 and a positive terminal 322 are the input terminals for this differential amplifier. Both negative terminal 320 and positive terminal 322 are coupled to both an N-type transistor and a P-type transistor. Specifically, negative terminal 320 is coupled to P-type transistor 300 and to N-type transistor 304; positive terminal 322 is coupled to P-type transistor 302 and N-type transistor 306.

One problem with the circuit illustrated in FIG. 3 is the resulting change in the transconductance of the circuit. This problem can be illustrated in the graph of FIG. 4, where axis 410 represents the transconductance $G_m$ of the circuit of FIG. 3 and axis 420 represents the common-mode input voltage.

In region 400, only the P-type transistors are operating such that the transconductance of the circuit comprises only the transconductance of the P-type transistors. In region 404, only the N-type transistors are operating such that the transconductance of the circuit comprises only the transconductance of the N-type transistors. Ideally, the circuit is constructed such that the transconductance of the N-type transistors is approximately the same as the transconductance of the P-type transistors. Therefore, the transconductance in region 400 is equal to the transconductance in region 404. However, in a region 402, wherein both pairs of transistors are operating, the transconductance of the circuit in region 402 comprises the sum of the transconductance of the N-type transistors and the transconductance of the P-type transistors. Because the transconductances for both types of transistors are ideally equal, the total transconductance in region 402 is approximately double the transconductance of the circuit in region 400 and region 404.

It is not desirable to have a transconductance that varies with the common-mode input voltage. As explained above, the gain of an op-amp using this type of configuration is linearly related to the transconductance of amplifier stage 100 (gain=$G_m/sC$). Since the gain of the op-amp is dependent on the transconductance $G_m$ of amplifier stage 100, the gain of the op-amp is not constant. In addition, the frequency response of the op-amp varies if transconductance $G_m$ is not constant, as the time constant of the circuit varies with $G_m$. Accordingly corner frequency 210 of FIG. 2 tends to vary, resulting in an unstable frequency response.

As described in Johan H. Huijsing et al., *Low-Power Low-Voltage VLSI Operational Amplifier Cells*, IEEE Transactions on Circuits and Systems, Vol. 42, No. 11 (November 1995), the problem described above is also present in circuits using bipolar transistors. One solution for bipolar circuits, according to Huijsing et al., is to keep constant the sum of the tail currents for the N-type transistors and for the P-type transistors.

An application of the Huijsing et al. solution to FET circuits is shown in FIG. 5. Transistors 300, 320, 304, and 306 are identical to those shown in FIG. 3. It should be noted that the connections from transistors 300, 320, 304, and 306 to the next stage are omitted to facilitate a discussion of FIG. 5. Current source 308 is analogous to current source 308 in FIG. 3. However, there is no separate current source for the N-type transistors. Additional transistors 526, 528, and 530, along with a voltage source 524, are configured to direct the current from current source 308 to supply the N-type transistors. Specifically, transistor 526 is a current transfer transistor while transistors 528 and 530 comprise a current mirror that supplies the current to the N-type transistors. Meanwhile, voltage source 524 biases transistor 526 such that transistor 526 is in a proper operating mode. Accordingly, the total supply current in the circuit is kept constant, i.e., the P-type transistors are directly supplied current by current source 308, while the N-type transistors are indirectly supplied current by current source 308 through use of transistors 526, 528, and 530.

At low input voltages, only P-type transistors 300 and 302 are operating, each being supplied current by current source 308 and generating output tail currents 550 and 552 at their respective drains. Although not shown, tail currents 550 and 552 may be summed and propagated to the next stage of the op-amp. At high input voltages, only N-type transistors 304 and 306 are operating. In this case, no current is being supplied to the P-type transistors. Current source 308 supplies current to the N-type transistors 304 and 306 though transistors 526, 528, and 530, with resulting output tail currents 554 and 556 being present at the drains of N-type transistors 304 and 306. Although not shown, tail currents 554 and 556 may also be summed and propagated to the next stage of the op-amp. Therefore, when an input pair, such as input transistors 300 and 302 or transistors 304 and 306, is operating, the input pair is being supplied current by a current source, with a non-zero tail current being present.

As discussed, in region 402 of FIG. 4, both the P-type input pair and the N-type input pair are operating. Thus, both input pairs are being supplied with current, e.g., the P-type input pair being directly supplied by current source 308 and the N-type input pair being supplied through transistors 526, 528, and 530.

However, the above configuration does not operate optimally if the FETs are not biased during weak inversion, i.e., when the gate is biased below the threshold voltage. Moreover, if the FETs are biased during strong inversion, i.e., when the gate voltage is larger than the threshold voltage, transconductance $G_m$ still varies by approximately 40% since transconductance $G_m$ is proportional to the square root of the drain current. In contrast, transconductance $G_m$ is linearly proportional to the drain current for both BJTs and FETs during weak inversion.

The Huijsing et al. reference further suggests the use of an op-amp circuit that supplies each of the input transistor pairs with four times the normal tail current when the other pair is switched off. Huijsing et al. discloses that a transconductance $G_m$ that varies by about 15% across the amplifier's operating range can be realized. However, many applications today require the further reduction of the variation of transconductance $G_m$ significantly below that available from the prior art.

SUMMARY OF THE INVENTION

The present invention addresses many of the shortcomings of the prior art. In accordance with one aspect of the present invention, an operational amplifier circuit comprising a differential input stage includes an input stage and a proportional input stage and a minimum selector circuit. In accordance with an exemplary embodiment, the minimum selector circuit is suitably configured to receive two input currents provided by the input stage and the proportional input stage, and then output the minimum current to a current transfer circuit. The current transfer circuit is suitably coupled to the input stage. The minimum current can be suitably subtracted from the output current of the current transfer circuit to reduce the total transconductance of the operational amplifier circuit.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. In addition, the present invention may be practiced in any integrated circuit application where a reduction in the transconductance of operational amplifiers are desired. Such general applications that may be appreciated by those skilled in the art in light of the present disclosure are not described in detail herein. However for purposes of illustration only, exemplary embodiments of the present invention will be described herein in connection with differential input stage circuits for operational amplifiers. Further, it should be noted that while various components may be suitably coupled or connected to other components within exemplary circuits, such connections and couplings can be realized by direct connection between components, or by connection through other components and devices located therebetween.

Figure 1:
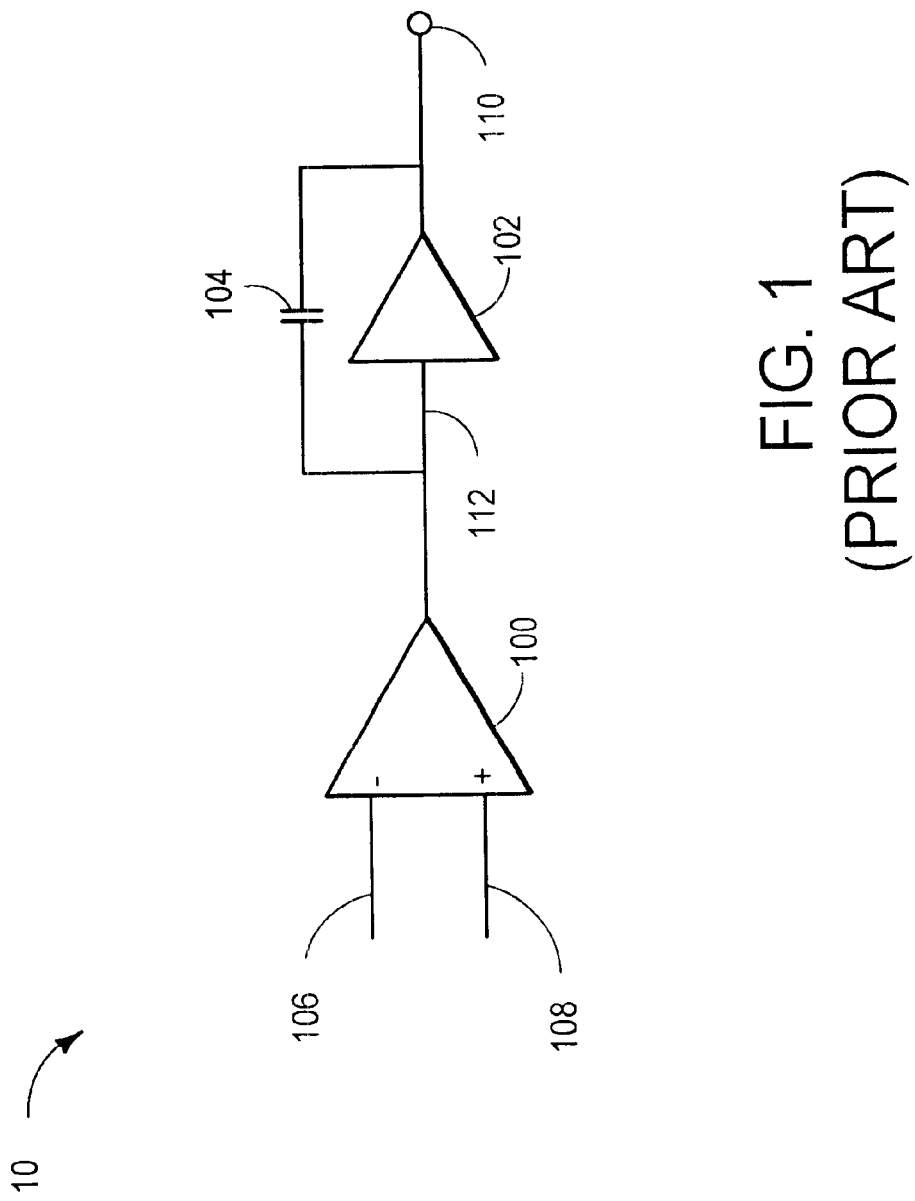
FIG. 1 shows a block diagram view of a prior art op-amp configuration.
Figure 2:
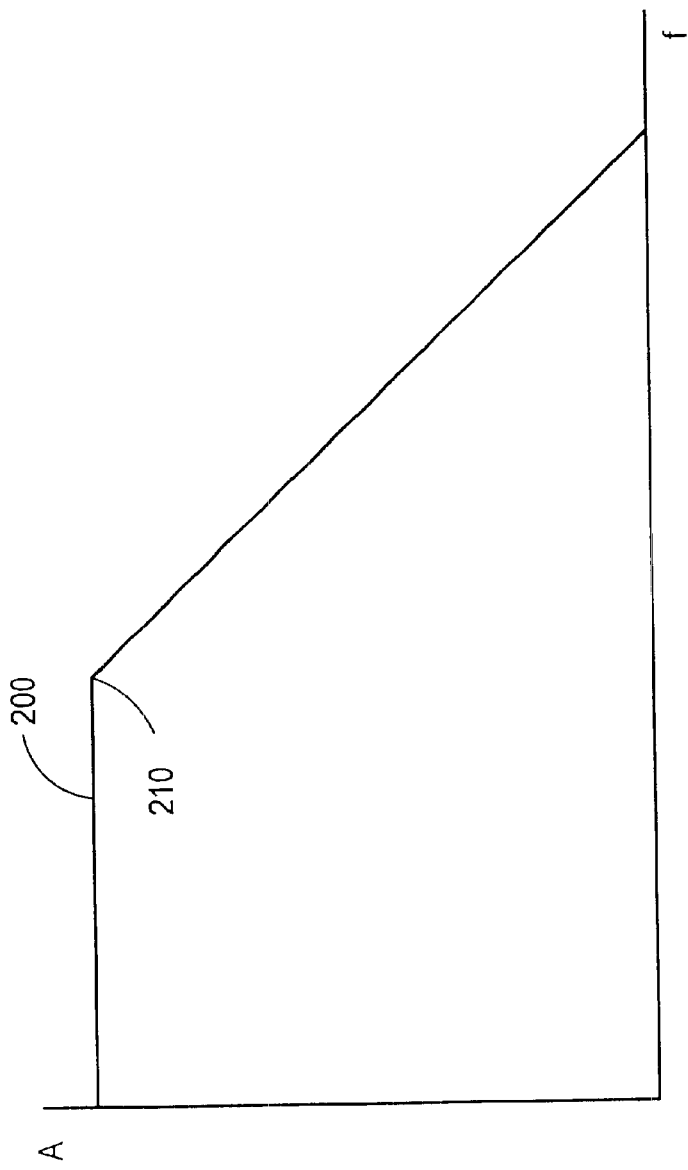
FIG. 2 illustrates the frequency response of a prior art op-amp configuration.
Figure 3:
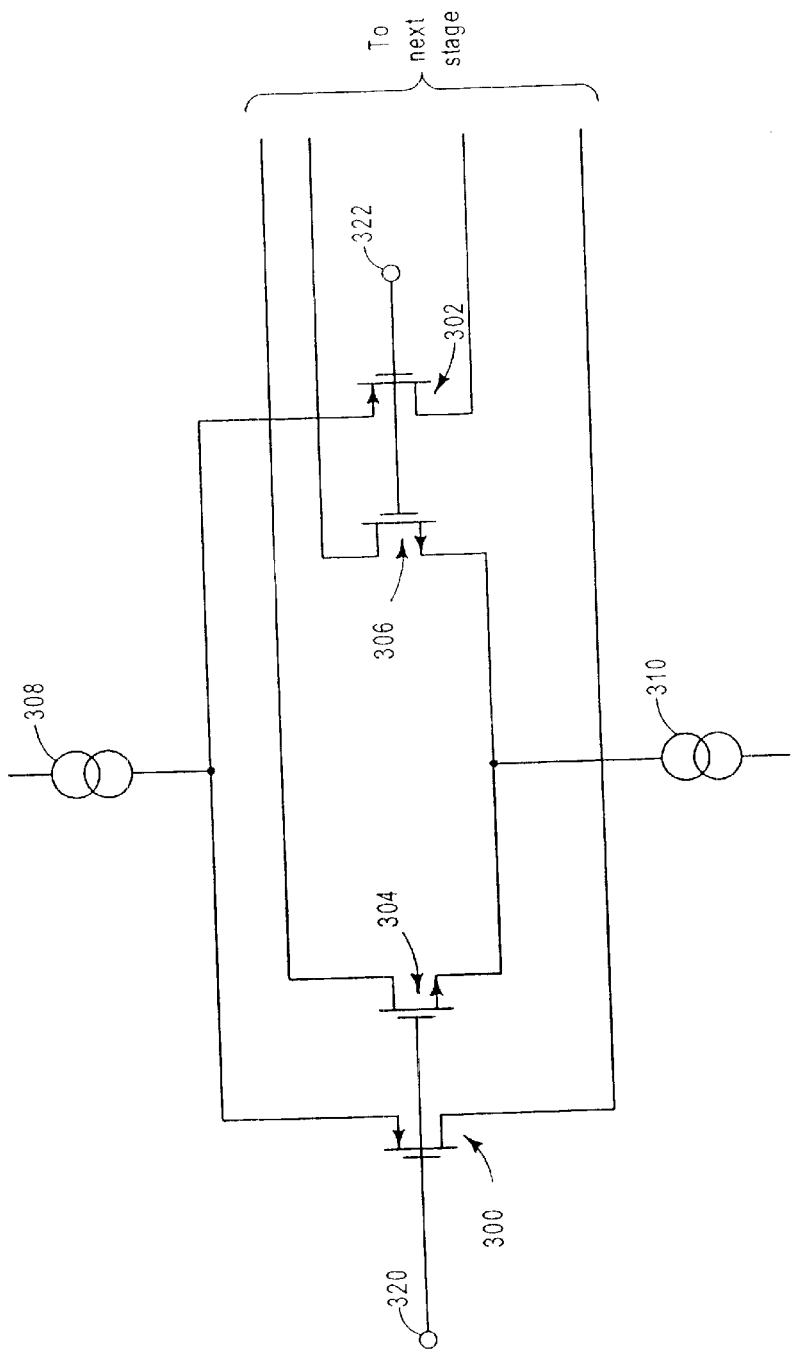
FIG. 3 illustrates a prior art CMOS configuration of the differential input stage of a rail-to-rail op-amp.
Figure 4:
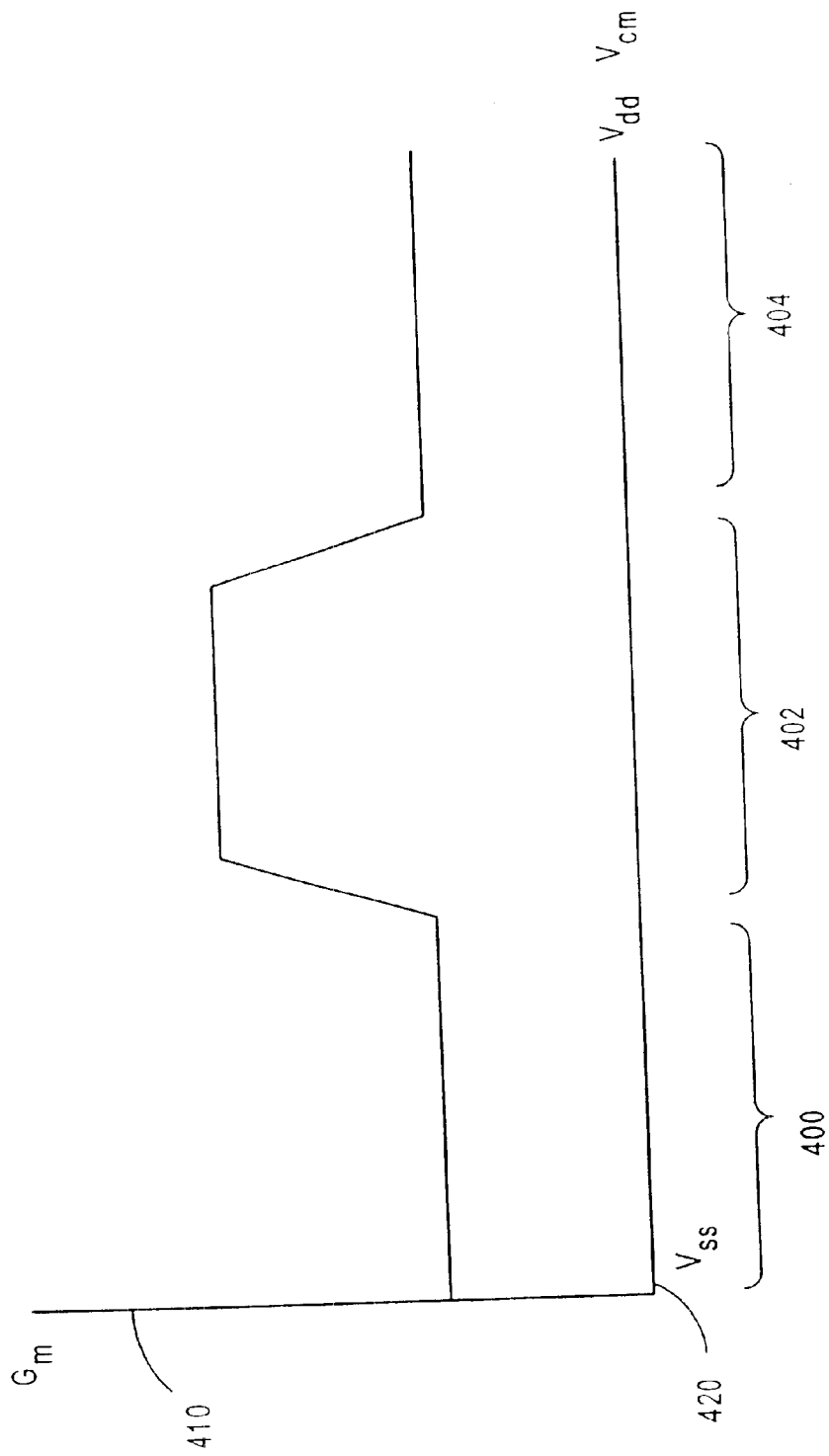
FIG. 4 illustrates a graph of the transconductance of the circuit of FIG. 3 versus common-mode input voltage.

For an op-amp circuit as shown in FIGS. 3 and 4, the increased transconductance is a result of both the P-type input pair and the N-type input pair operating simultaneously. Thus, if one could limit the operation of one of the input pairs within this operating region, one may be able to reduce the total transconductance of the circuit. In accordance with the present invention, an exemplary method of limiting the operation of one input pair comprises first the determination of when both input pairs are operating and then second the limiting of the supply current to one of the input pairs. To determine if an input pair is operating, the current being supplied to the input pair can be suitably monitored. Another exemplary method that can be used to determine if an input pair is operating is to monitor the tail current from the input pair. In both cases, a non-zero supply or tail current indicates that the pair is operating.

In accordance with an exemplary embodiment of the present invention, an exemplary method of monitoring the currents comprises the creation of a duplicate pair of one of the input pairs of transistors and a duplicate of the current supply and current transfer circuit. The duplicate input pair of transistors can then be used to measure either the supply current or the output current of the N-type input pair and the P-type input pair of transistors. The current supply for the duplicate input pair of transistors comprises a replica of the current supply for the input transistors. In accordance with this aspect, if the duplicate of the current source and the duplicate of the input pair are both smaller in size than the original components, then both the duplicate input pair and the duplicate current supply are substantially identical in proportion to the original components. For example, if the duplicate of the input pair is 10% of the size of the original input pair, the duplicate of the current source would also be 10% of the size of the original current source. It should be noted that one reason to use transistors that are smaller than the transistors being duplicated would be to prevent the consumption of an excessive amount of power through the use of an additional, full-size input pair. However, other size variations, for example, from 5% or less to the original full-size, can be utilized in accordance with various embodiments of the present invention. In addition, while having the ratios between the current source and the duplicate current source and between the input pair and the duplicate input pair exactly equal is desirable, other equal ratios are acceptable, for example, within 20% or less of each other.

In accordance with another aspect of the present invention, the duplicate input pair is operational when the original input pair is operational. For example, in the case where the P-type transistors are duplicated and the original P-type transistors are operating, the duplicate of the P-type transistors is operating as well, thus producing an output tail current. Accordingly, it has been discovered that one can determine when an input pair is operating by also monitoring the current of the duplicate input pair.

The duplicate components and devices described above can be used to determine when each input pair is operating. For example, when the P-type input pair is operating (if it is the P-type transistors that are duplicated), the duplicate input pair supplies a tail current; when the N-type input pair is operating, a duplicate current transfer circuit, having a proportional current to the original transfer circuit by a ratio substantially equal as described above, is operating. Accordingly, by monitoring the duplicate transfer circuit and the tail current of the duplicate input pair, one is able to determine when each input pair is operating as well as when both input pairs are operating.

Once it is determined that both input pairs are operating, the current supplying one of the input pairs of transistors can be suitably decreased, while the current supply of the other input pair can be suitably maintained. In this manner, the transconductance of one of the pairs of input transistors is suitably reduced when both pairs are operating, thus reducing the transconductance of the entire input stage. Further, it should be noted that, with proper adjustments, the transconductance of the circuit can be reduced such that the transconductance is constant, e.g., within 5% or less linearity throughout its operating range.

Figure 5:
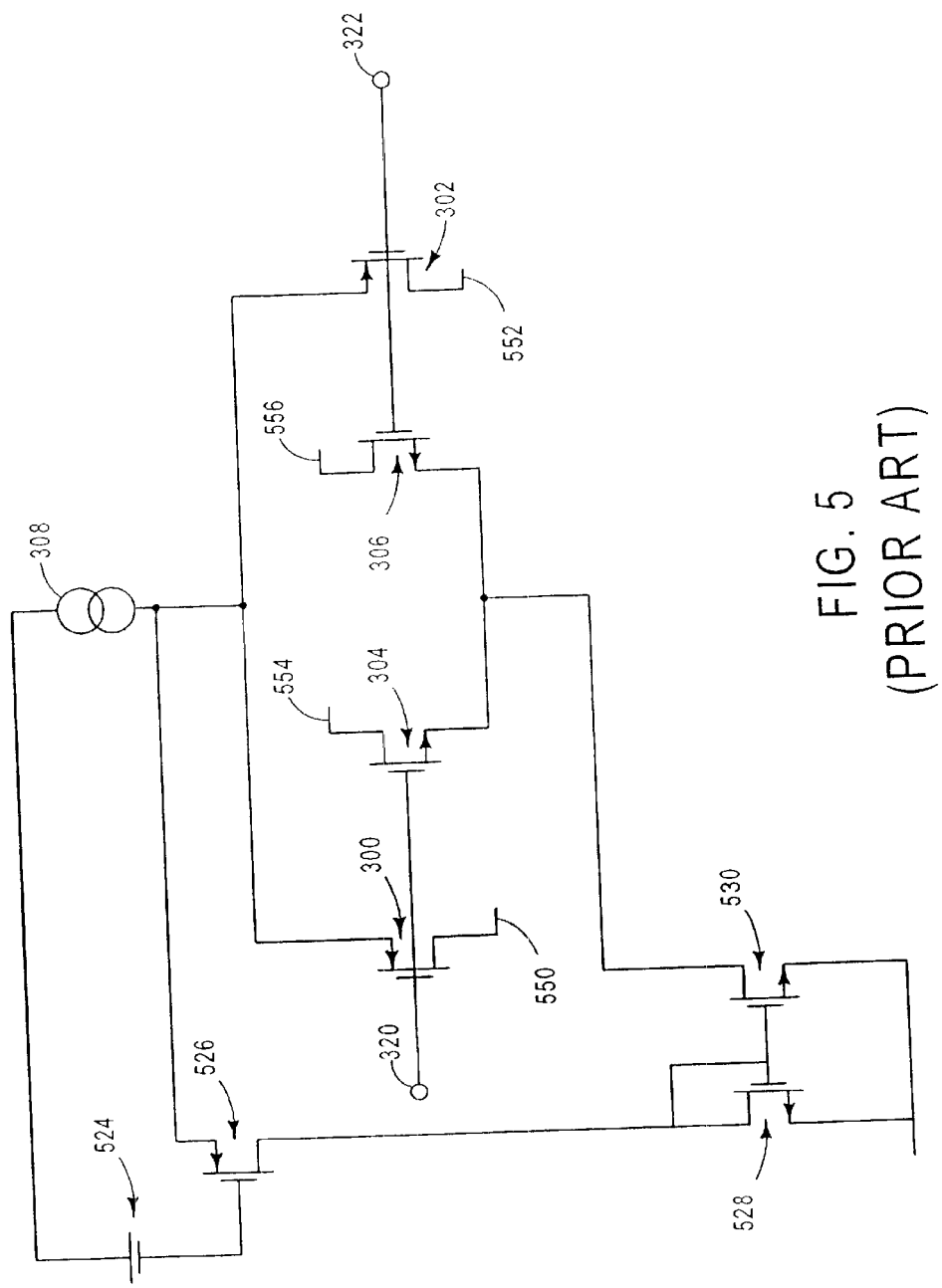
FIG. 5 is a CMOS differential input stage of a rail-to-rail op-amp incorporating a circuit to maintain the tail currents at a constant level.
Figure 6:
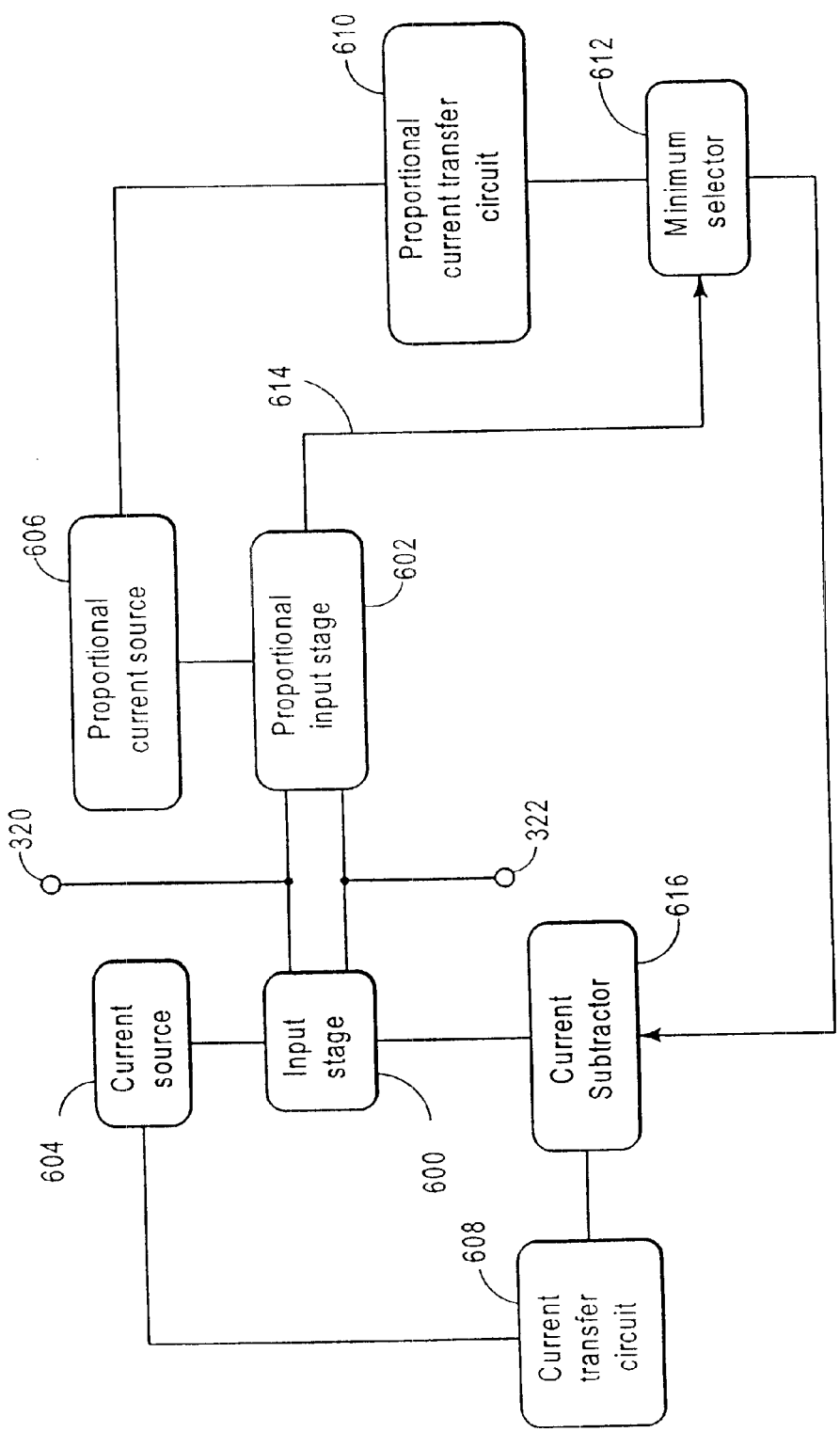
FIG. 6 is a block diagram of an exemplary op-amp circuit in accordance with an embodiment of the present invention.

A block diagram of an exemplary embodiment of an op-amp circuit is illustrated in FIG. 6. Inputs 320 and 322 are equivalent to those of FIG. 3. In this case, inputs 320 and 322, in addition to being coupled to input stage 600 (comprising, for example, transistors 300, 302, 304, and 306 of FIG. 3), are also coupled to proportional input stage 602. Proportional input stage 602 contains one duplicate pair of input transistors. Transistors, either N-type or P-type, that are equally proportional to those transistors in input stage 600 can be suitably provided in proportional input stage 602. In the exemplary embodiment, a pair of P-type transistors is provided in proportional input stage 602. However, it should be understood that this exemplary circuit can also be implemented by using a duplicate of the pair of N-type transistors with no change in functionality. Current source 604 supplies current to the P-type transistors of input stage 600. The functionality of current source 604 is similar to the functionality of current source 308 in FIG. 5. The current for the N-type transistors is supplied by current transfer circuit 608. The functionality of current transfer circuit 608 is similar to the functionality of elements 524 and 526 of FIG. 5.

The configuration of the input pairs of input stage 600 is suitably matched in the proportional input stage 602. Proportional input stage 602 produces a tail current 614 based on the inputs to proportional input stage 602. Tail current 614 is proportional to the tail current generated in input stage 600. Proportional current source 606 supplies current to proportional input stage 602. The size ratio of proportional current source 606 to current source 604 is the substantially the same as the size ratio of proportional input stage 602 to input stage 600, e.g., the respective ratios have a 10% difference or less between them. Proportional transfer circuit 610 is otherwise configured substantially similar to current transfer circuit 608. The size ratio of proportional transfer circuit 610 to current transfer circuit 608 is substantially the same as the ratio of proportional current source 606 to current source 604.

A minimum selector 612 has two inputs and one output. In accordance with the exemplary embodiment, minimum selector 612 includes an input comprising an amount of current from proportional transfer circuit 610 that is proportional to the current of current transfer circuit 608. Minimum selector 612 also receives an input current from proportional input stage 602 comprising tail current 614, which is proportional to the tail current of input stage 600. Accordingly, one input is coupled to proportional transfer circuit 610 and the other input is coupled to tail current 614. Minimum selector 612 is suitably configured to output the minimum current from the two inputs to current subtracter 616.

Current subtracter 616 also has two inputs. One input is coupled to current transfer circuit 608, while the other input is coupled to the output of minimum selector 612. Current subtracter 616 is configured to subtract the current it receives from minimum selector 612 from the current it receives from current transfer circuit 608, and to output the resulting current to input stage 600. In particular, in this exemplary embodiment, the N-type transistors are supplied current by current subtracter 616. Accordingly, the current supplied to the N-type transistors in input stage 600 is suitably reduced.

During operation, when the common-mode input voltage is low, only the P-type circuit is operating. The current of current transfer circuit 608 is zero, as no current is being supplied to operate the N-type circuit by the current transfer circuit 608, thus the value of proportional current transfer circuit 610 is also zero. In that the inputs to minimum selector 612 are zero (the input from proportional transfer circuit 610 and tail current 614), the output of minimum selector 612 is also zero. The output of minimum selector 612 is then subtracted from current transfer circuit 608, however since the output of minimum selector 612 is zero, no current is subtracted from the current supply to the N-type circuit.

When the common mode input voltage is high, only the N-type circuit is operating. The tail current of proportional input stage 602 is thus zero because the tail current of the P-type transistors in input stage 600 is zero. The inputs to minimum selector 612 are the current in proportional transfer circuit 610 and tail current 614, both of which are zero. The output of minimum selector 612 is thus zero. This output of minimum selector 612 is then subtracted from current transfer circuit 608 through current subtracter 616. Therefore, no current is subtracted from the current supply to the N-type circuit. Accordingly, minimum selector 612 has no effect on the circuit when only one of the pairs of transistors is operating.

However, as explained above, when the common mode input voltage comprises an intermediate voltage, such as that illustrated within region 402 of FIG. 4, both the N-type transistors and P-type transistors are operating. Thus, there is current in both tail current 614 and proportional current transfer circuit 610. Those two currents are suitably received into minimum selector 612 and the output, which comprises the smaller of those two currents, is suitably received by current subtracter 616, resulting in a smaller supply current available for the N-type transistors in input stage 600. This decrease in supply current reduces the operation of the N-type transistors. Accordingly, this reduction in the operation of the N-type transistors suitably results in a lower total transconductance of the input stage.

As the common-mode input voltage increases from the operating region of the P-type transistors to the transition area (e.g., region 402 of FIG. 4), the N-type transistors start operating. Initially, proportional current transfer circuit 610 has less current than tail current 614. As the common-mode input voltage continues to increase, the output of the minimum selector 612, i.e., the amount of current being subtracted, suitably increases. As the common-mode input voltage increases further, the lower current becomes that of tail current 614, as the effect of the N-type transistor becomes greater. Thus, less current is subtracted by current subtracter 616, enabling the N-type transistors to operate more fully as the P-type transistors enter the region where they are less effective (i.e., region 404 of FIG. 4). At a suitably configured voltage level, the P-type transistors turn off completely, resulting in no current being subtracted by current subtracter 616, as explained above.

Figure 7:
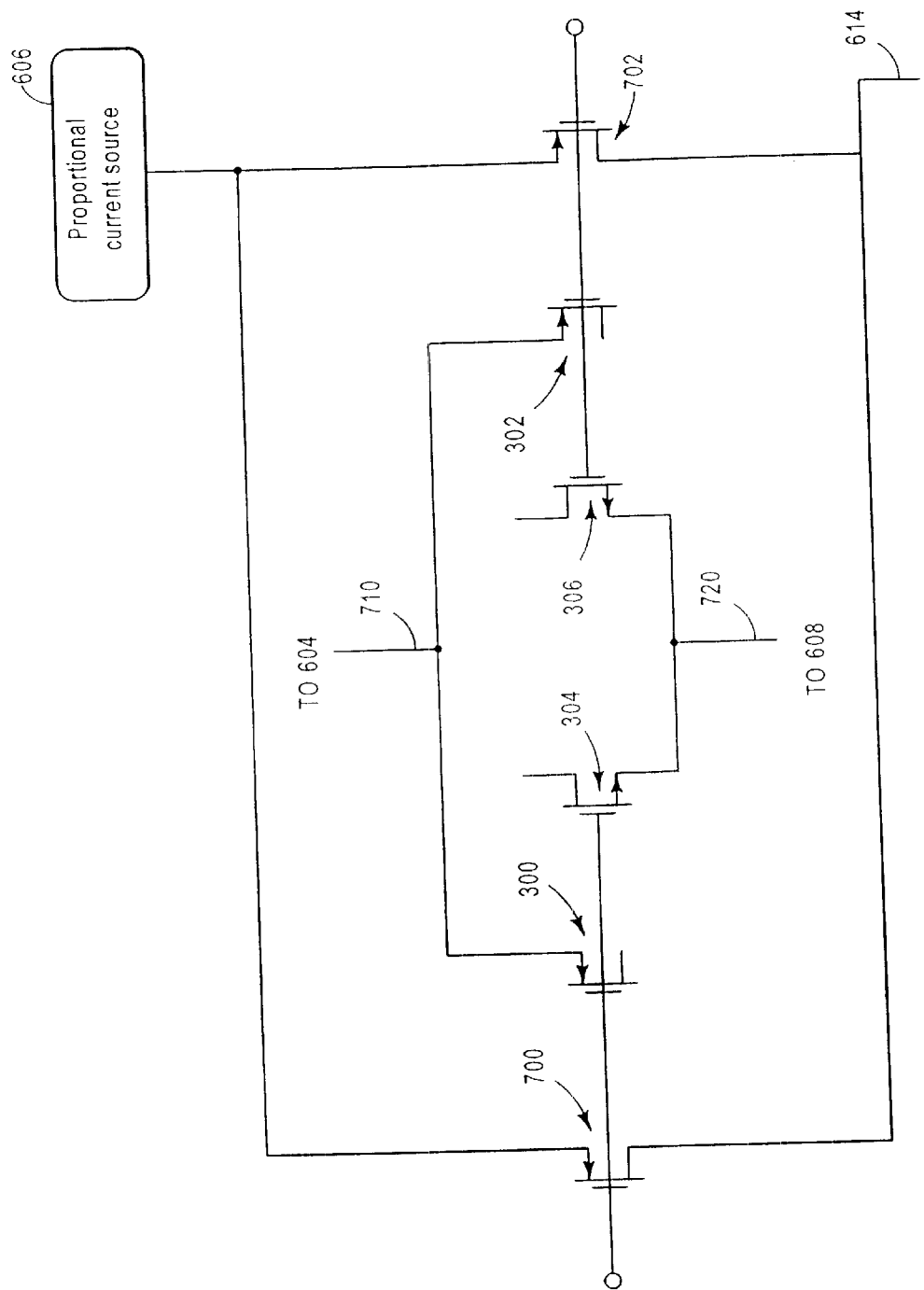
FIG. 7 illustrates an exemplary input stage of one embodiment in accordance with the present invention.

With additional reference to FIG. 7, an exemplary circuit layout of the input stage is illustrated in FIG. 6 including input stage 600 and proportional input stage 602. In this example, transistors 300, 302, 304, and 306 are as described in FIG. 3. To clarify the discussion of FIG. 7, various of the connections from transistors 300, 302, 304, and 306 are not illustrated in FIG. 7. P-type transistors 300 and 302 are supplied current by current source 604 through lead 710. N-type transistors 304 and 306 are supplied current by current transfer circuit 608 through lead 720. P-type transistors 700 and 702 comprise the proportional input stage 602 illustrated in FIG. 6. The tail currents of P-type transistors 700 and 702 are connected together at junction 614 and propagate to minimum selector 612.

The pair of transistors 700 and 702 operates substantially the same as the operation of P-type transistors 300 and 302, i.e., transistors 700 and 702 draw an amount of current proportional to the current drawn by transistors 300 and 302. Transistors 700 and 702 also output a tail current 614 that is proportional to the tail current of transistors 300 and 302.

Figure 8:
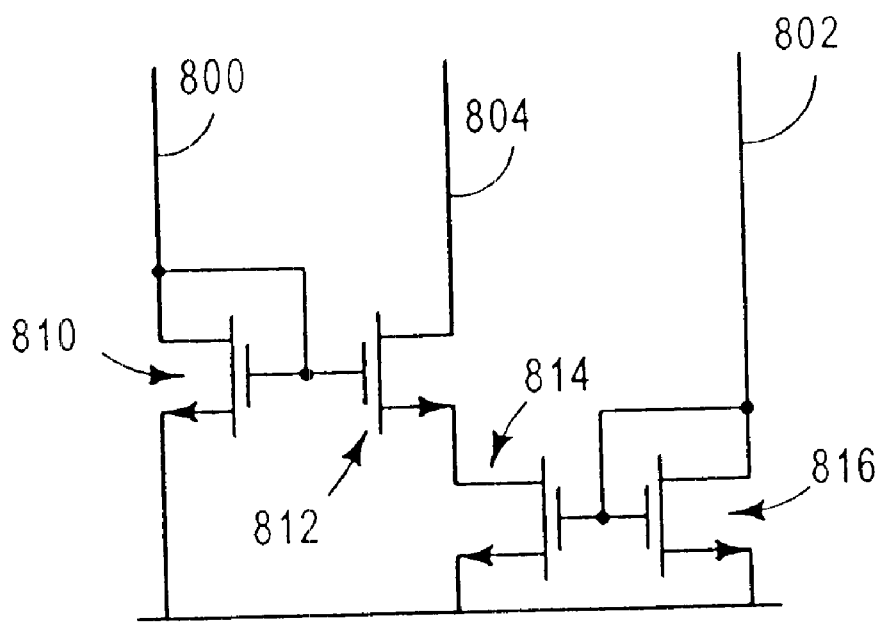
FIG. 8 illustrates an exemplary minimum selector circuit in accordance with an embodiment of the present invention.

With reference to FIG. 8, an exemplary minimum selector circuit 800 is illustrated. The circuit receives input currents from input 801 and 802 and outputs the lesser of the two input currents at output 804. The exemplary circuit, as illustrated, comprises four N-type transistors 810, 812, 814, and 816. Input 801 is suitably configured at the drain of transistor 810, while input 802 is configured at the drain of transistor 816. The gates of transistors 810 and 812 are coupled together, as are the gates of transistors 814 and 816. Transistors 810 and 816 are both configured in a diode-connected manner, wherein the drain of a transistor is coupled to the gate of that transistor. The source of transistor 812 is connected to the drain of transistor 814. The sources of transistors 810, 814, and 816 are all coupled to the negative power supply. Output 804 is connected to the drain of transistor 812. It should be understood that minimum selector circuit 800 is merely an example of the type of circuit that could be used to output the minimum of two input currents, i.e., minimum selector circuit 800 can be replaced with any circuit configured to determine the minimum of two input currents with no effect in the functionality or operation of the invention.

Figure 9:
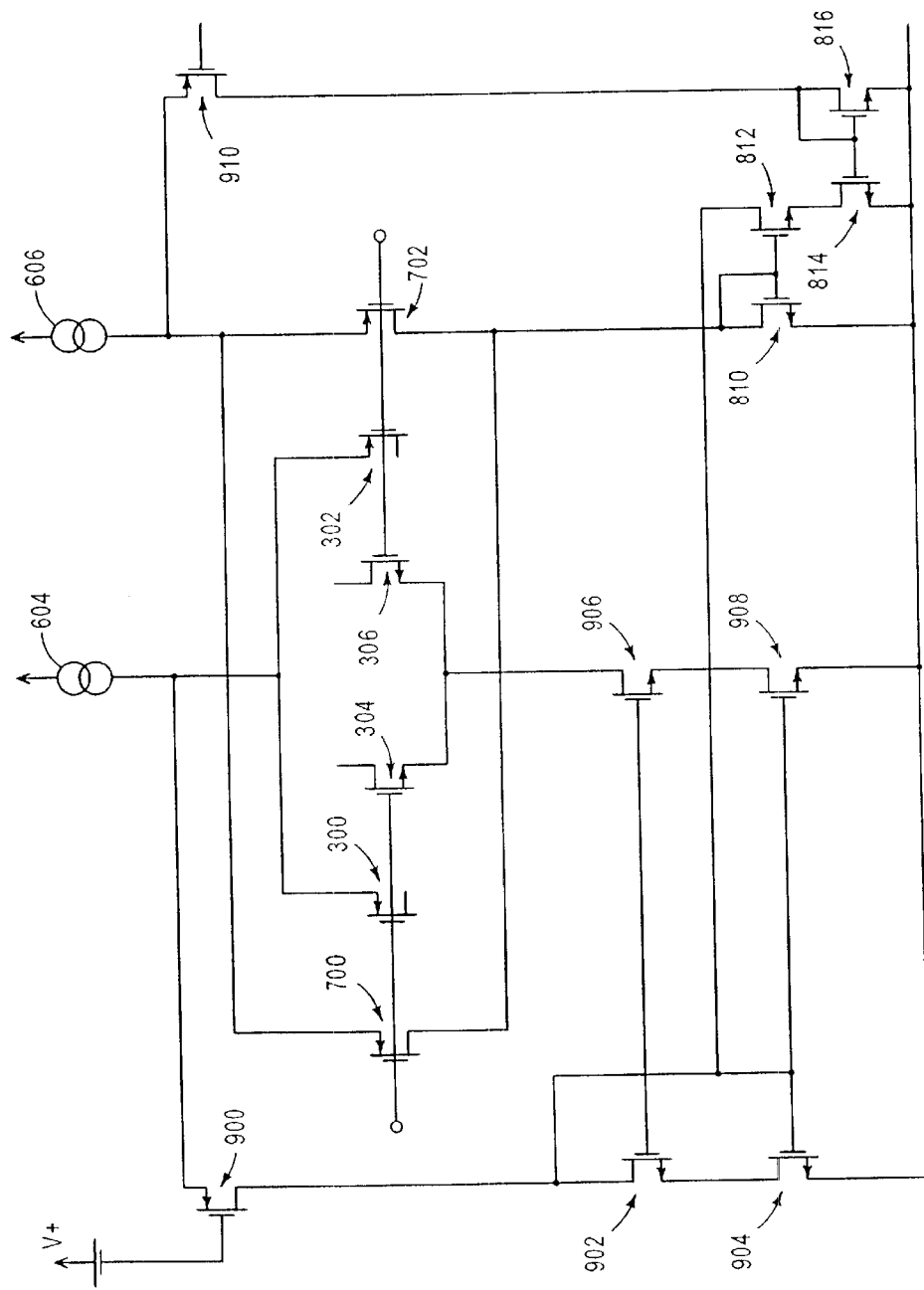
FIG. 9 shows am exemplary schematic of an op-amp circuit incorporating the exemplary circuits shown in FIGS. 7 and 8.

With reference to FIG. 9, a more detailed schematic of the exemplary circuit in FIG. 6, incorporating the circuits shown in FIG. 7 and FIG. 8, is illustrated. Current transfer circuit 608 and current subtracter 616 of FIG. 6 are suitably embodied in transistors 900, 902, 904, 906, and 908 in FIG. 9. Transistor 900 is configured to switch current being supplied to the P-type transistors to current for supplying the N-type transistors. Transistors 902, 904, 906, and 908 are configured as a current mirror to suitably direct the current from transistor 900 to the N-type transistors 304 and 306, less the current output from the minimum selector circuit 800. Transistors 810, 812, 814, and 816 comprise minimum selector circuit 800 as described above with respect to FIG. 8.

The output from minimum selector circuit 800 is configured at the source of transistor 812. FIG. 9 shows that the output is coupled between the drain of transistor 902 and the source of transistor 904. The presence of a current at the source of transistor 812 serves to reduce the current being supplied to the N-type transistors 304 and 306. Thus, when the output of minimum selector 800 is not zero, the current supply to the N-type transistors is suitably reduced, along with the transconductance of the N-type transistors. Moreover, the transconductance of the circuit illustrated in FIG. 9 is suitably reduced.

The above description presents exemplary modes contemplated in carrying out the invention. The techniques described above are, however, susceptible to modifications and alternate constructions from the embodiments shown above. Other variations and modifications of the present invention will be apparent to those of ordinary skill in the art, and it is the intent of the appended claims that such variations and modifications be covered. For example, while the invention has been described with the use of a duplicate of the P-type transistors, it is also possible to use a duplicate of the N-type transistors.

Consequently, it is not the intention to limit the invention to the particular embodiments disclosed. On the contrary, the invention is intended to cover all modifications and alternate constructions falling within the scope of the invention, as expressed in the following claims when read in light of the description and drawings. No element described in this specification is necessary for the practice of the invention unless expressly described herein as "essential" or "required."

We claim:

1. A differential input stage of an operational amplifier configured for providing a constant transconductance independent of a common-mode input voltage, said differential input stage comprising:

a positive input terminal;

a negative input terminal;

an input stage coupled to said positive input terminal and said negative input terminal;

a current source for providing a first current supply to said input stage;

a current transfer circuit coupled to said current source for providing a second current supply;

a proportional input stage coupled to said positive input terminal and said negative input terminal;

a proportional current source coupled to said proportional input stage for providing a current proportional to said first current supply;

a proportional current transfer circuit coupled to said proportional current source for providing a current proportional to said second current supply;

a minimum selector circuit configured to select a minimum current;

wherein said differential input stage is configured to provide a reduced transconductance by subtracting said minimum current from said second current supply.

2. The differential input stage of claim 1 wherein:

said input stage comprises a pair of N-type transistors and a pair of P-type transistors.

3. The differential input stage of claim 1 wherein:

a ratio of sizes of said proportional input stage to said input stage is equal to X;

the ratio of sizes of said proportional current source to said current source is equal to X; and the ratio of sizes of said proportional current transfer circuit to said current transfer circuit is equal to X; wherein X is less than 1.

4. The differential input stage of claim 3 wherein X is approximately 0.10.

5. The differential input stage of claim 2 wherein said minimum selector comprises a first input, a second input and an output; and wherein said output comprises said minimum current that is equal to a smaller current between a current of said first input and a current of said second input.

6. The differential input stage of claim 5 wherein:

said first input of said minimum selector is coupled to said proportional current transfer circuit;

said second input of said minimum selector is coupled to said proportional input stage; and said output of said minimum selector is coupled to said current transfer circuit to provide said minimum current.

7. The differential input stage of claim 6 wherein:

said current transfer circuit comprises a first input, a second input, and an output; wherein said output of said current transfer circuit comprises a current that is equal to the difference of a current of said first input of said current transfer circuit and a current of said second input of said current transfer circuit.

8. The differential input stage of claim 7 wherein, said output of said current transfer circuit is coupled to said input stage.

9. The differential input stage of claim 8 wherein, said proportional input stage comprises a pair of P-type transistors.

10. The differential input stage of claim 9 wherein, said output of said current transfer circuit is coupled to said pair of N-type transistors in said input stage.

11. The differential input stage of claim 8 wherein, said proportional input stage comprises a pair of N-type transistors.

12. The differential input stage of claim 9 wherein, said output of said current transfer circuit is coupled to said pair of P-type transistors in said input stage.

13. The differential input stage of claim 5, wherein said minimum selector comprises:

a first current mirror coupled to said first input of said minimum selector;

a second current mirror coupled to said second input of said minimum selector; and wherein said second current mirror is coupled to said first current mirror at a junction; and wherein said output of said minimum selector is coupled to said second current mirror.

14. The differential input stage of claim 13 wherein, said first current mirror comprises
  a first transistor comprising a gate, a source, and a drain configured as a diode-connected transistor;
  and a second transistor comprising a gate a source and a drain, wherein
  said gate of said first transistor is coupled to said gate of said second transistor, and said source of said first transistor is coupled to said source of said second transistor; and said second current mirror comprises
  a third transistor comprising a gate, a source, and a drain configured as a diode-connected transistor;
  and a fourth transistor comprising a gate a source and a drain, wherein
  said gate of said first transistor is coupled to said gate of said second transistor, and said source of said first transistor is coupled to said source of said second transistor;

wherein
  said drain of said first transistor is coupled to said first input of said minimum selector;
  said drain of said fourth transistor is coupled to said second input of said minimum selector;
  said source of said third transistor is coupled to said drain of said second transistor; and
  said drain of said fourth transistor is coupled to said output of said minimum selector circuit.

15. The differential input stage of claim 1 further comprising a current subtracter circuit coupled between said input stage and said current transfer circuit, wherein said current subtracter circuit comprises a first input, a second input, and an output; and said output having a current equal to a difference of a current of said first input of said current subtracter circuit and a current of said second input of said current subtracter circuit.

16. The differential input stage of claim 15 wherein said first input is coupled to said current transfer circuit;

said second input is coupled to said minimum selector circuit; and said output is coupled to said input stage.

17. The differential input stage of claim 14 wherein:

said drain of said first transistor is coupled to said first input;

said source of said first transistor is coupled to said drain of said second transistor;

said source of said first transistor is further coupled to said second input;

said gate of said first transistor is coupled to said gate of said third transistor;

said gate of said second transistor is coupled to said gate of said fourth transistor;

said gate of said second transistor is further coupled to said drain of said first transistor;

said source of said second transistor is coupled to said source of said fourth transistor and to a power supply;

said drain of said fourth transistor is coupled to said source of said third transistor; and said drain of said fourth transistor is coupled to said output.

18. A differential input stage of an operational amplifier configured for providing a constant transconductance independent of a common-mode input voltage, said differential input stage comprising:

an input stage having a positive input terminal and a negative input terminal;

a current source for providing a first current supply to said input stage;

a current transfer circuit coupled to said current source for providing a second current supply;

a proportional input stage coupled to said positive input terminal and said negative input terminal;

a proportional current source coupled to said proportional input stage for providing a current proportional to said first current supply;

a proportional current transfer circuit coupled to said proportional current source for providing a current proportional to said second current supply;

a minimum selector circuit configured to select a minimum current between a current monitored from said proportional input stage and said current of said proportional transfer circuit;

wherein said differential input stage is configured to provide a reduced transconductance by subtracting said minimum current from said second current supply.

19. A method of determining when input transistor pairs of an amplifier are operating to reduce the current supplied to one of the input transistor pairs and control the transconductance of the amplifier, said method comprising:

providing an amplifier input stage comprising a pair of N-type transistors and a pair of P-type transistors;

providing a current transfer circuit for transferring current to said N-type transistors;

monitoring the supply current to said N-type transistors;

monitoring the output current from said P-type transistors; and subtracting current from said current transferred by said current transfer circuit when both said pair of N-type transistors and said pair of P-type transistors are operating.

20. The method of claim 19 wherein said supply current monitoring step is performed by monitoring a proportional replica of said current transfer circuit; and said output current monitoring step is performed by monitoring a proportional replica of said P-type transistors.

21. A method of controlling the transconductance of a differential input stage of an amplifier, said method comprising:

providing a differential input stage comprising a pair of N-type transistors and a pair of P-type transistors;

providing a current transfer circuit to supply current to said N-type transistors;

monitoring the current supplied to said pair of N-type transistors;

monitoring an output current from said pair of P-type transistors; and reducing the current supplied to said pair of N-type transistors when it is determined by said supply current monitoring step and said output current monitoring step that both said P-type transistors and said N-type transistors are operating.

22. The method of claim 21 wherein said supply current monitoring said output current monitoring steps are performed by monitoring a proportional duplicate of said current transfer circuit and said P-type transistors, respectively.

23. A method of controlling the transconductance of an input stage of an amplifier, said method comprising:

providing an amplifier input stage comprising a pair of N-type transistors and a pair of P-type transistors;

providing a current transfer circuit to supply current to said P-type transistors;

monitoring the current supplied to said P-type transistors;

monitoring an output current from said N-type transistors; and reducing current being supplied to said pair of P-type transistors when it is determined by said supply current monitoring step and said output current monitoring step that both said P-type transistors and said N-type transistors are operating.

24. The method of claim 23 wherein said supply current monitoring said output current monitoring steps are performed by monitoring a proportional duplicate of said current transfer circuit and said N-type transistors, respectively.

* * * * *

UNITED STATES PATENT AND TRADEMARK OFFICE
CERTIFICATE OF CORRECTION

PATENT NO. : 6,462,619 B1 Page 1 of 1
DATED : October 8, 2002
INVENTOR(S) : Vadim V. Ivanov It is certified that error appears in the above-identified patent and that said Letters Patent is hereby corrected as shown below:

<u>Title page,</u>
Item [54], change "STAG" to -- STAGE --

Signed and Sealed this

Eighteenth Day of February, 2003

JAMES E. ROGAN
*Director of the United States Patent and Trademark Office*